(12) United States Patent
Izumi et al.

(10) Patent No.: US 10,431,311 B2
(45) Date of Patent: Oct. 1, 2019

(54) SEMICONDUCTOR MEMORY DEVICE

(71) Applicant: Toshiba Memory Corporation, Minato-ku (JP)

(72) Inventors: Tatsuo Izumi, Yokkaichi (JP); Reiko Komiya, Nagoya (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/056,804

(22) Filed: Aug. 7, 2018

(65) Prior Publication Data
US 2019/0189218 A1    Jun. 20, 2019

(30) Foreign Application Priority Data
Dec. 19, 2017 (JP) .................. 2017-242858

(51) Int. Cl.
| | |
|---|---|
| *G11C 16/04* | (2006.01) |
| *G11C 16/10* | (2006.01) |
| *H01L 27/11582* | (2017.01) |
| *H01L 29/10* | (2006.01) |
| *G11C 16/34* | (2006.01) |
| *G11C 16/08* | (2006.01) |

(52) U.S. Cl.
CPC .......... *G11C 16/10* (2013.01); *G11C 16/0466* (2013.01); *G11C 16/0483* (2013.01); *G11C 16/08* (2013.01); *G11C 16/3459* (2013.01); *H01L 27/11582* (2013.01); *H01L 29/1037* (2013.01)

(58) Field of Classification Search
CPC . G11C 16/10; G11C 16/0466; G11C 16/0483; G11C 16/08; G11C 16/3459; H01L 27/11582; H01L 29/1037

USPC .................. 365/185.11, 185, 17, 185.18
See application file for complete search history.

(56) References Cited

U.S. PATENT DOCUMENTS

| | | | |
|---|---|---|---|
| 9,311,993 | B2 | 4/2016 | Shimura et al. |
| 9,747,988 | B2 | 8/2017 | Maeda |
| 2009/0267128 | A1 | 10/2009 | Maejima |
| 2009/0268522 | A1 | 10/2009 | Maejima |
| 2010/0207195 | A1 | 8/2010 | Fukuzumi et al. |
| 2010/0214838 | A1 | 8/2010 | Hishida et al. |

(Continued)

FOREIGN PATENT DOCUMENTS

| | | |
|---|---|---|
| JP | 2014-225310 | 12/2014 |
| JP | 2017-152066 | 8/2017 |
| JP | 2017-157260 | 9/2017 |

*Primary Examiner* — Huan Hoang
(74) *Attorney, Agent, or Firm* — Oblon, McClelland, Maier & Neustadt, L.L.P.

(57) ABSTRACT

According to one embodiment, a semiconductor memory includes includes conductors, a pillar through the conductors, a controller. The pillar includes a first pillar portion, a second pillar portion, and a joint portion between the first pillar portion and the second pillar portion. Each of the portions where the pillar and the conductors cross functions as a transistor. Among the conductors through the first pillar portion, the conductor most proximal to the joint portion and one of the other conductors respectively function as a first dummy word line and a first word line. Among the conductors through the second pillar portion, the conductor most proximal to the joint portion and one of the other conductors respectively function as a second dummy word line and a second word line.

20 Claims, 11 Drawing Sheets

(56) References Cited

U.S. PATENT DOCUMENTS

| | | |
|---|---|---|
| 2011/0284946 A1 | 11/2011 | Kiyotoshi |
| 2012/0069663 A1 | 3/2012 | Itagaki et al. |
| 2014/0340964 A1 | 11/2014 | Shiino et al. |
| 2017/0256316 A1 | 9/2017 | Maejima |
| 2019/0108883 A1* | 4/2019 | Yu .......................... G11C 16/10 |

* cited by examiner

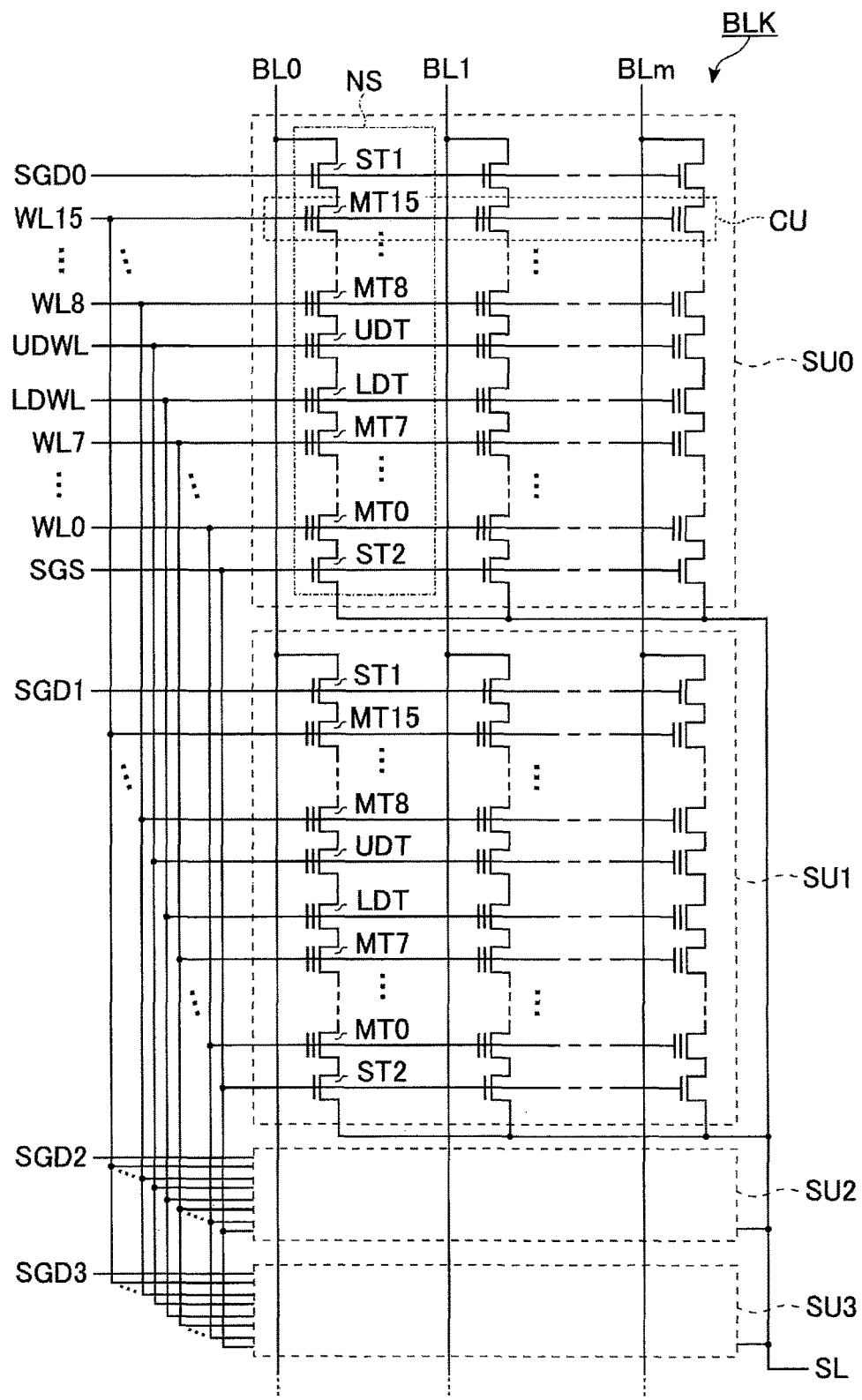
F I G. 2

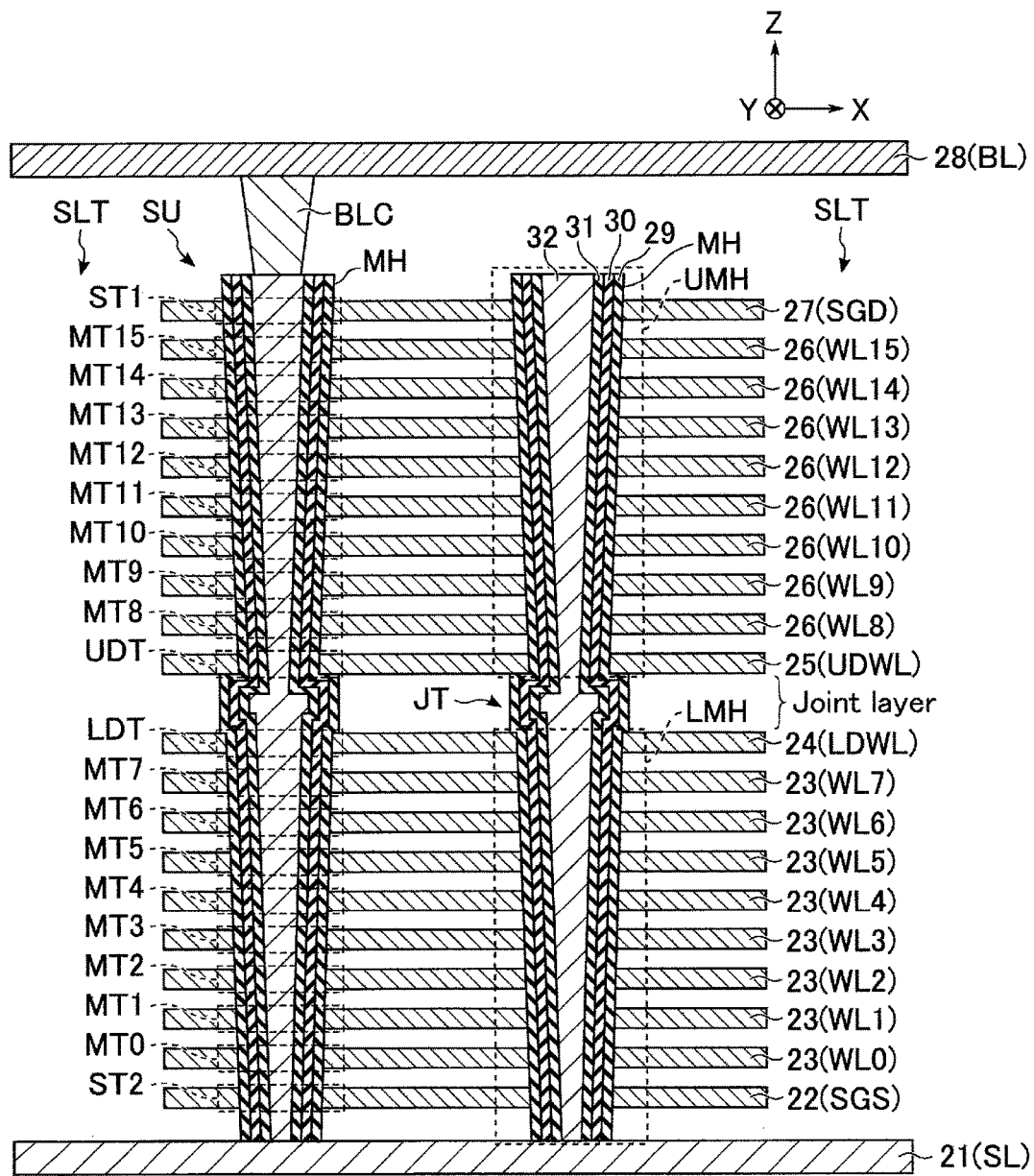
F I G. 4

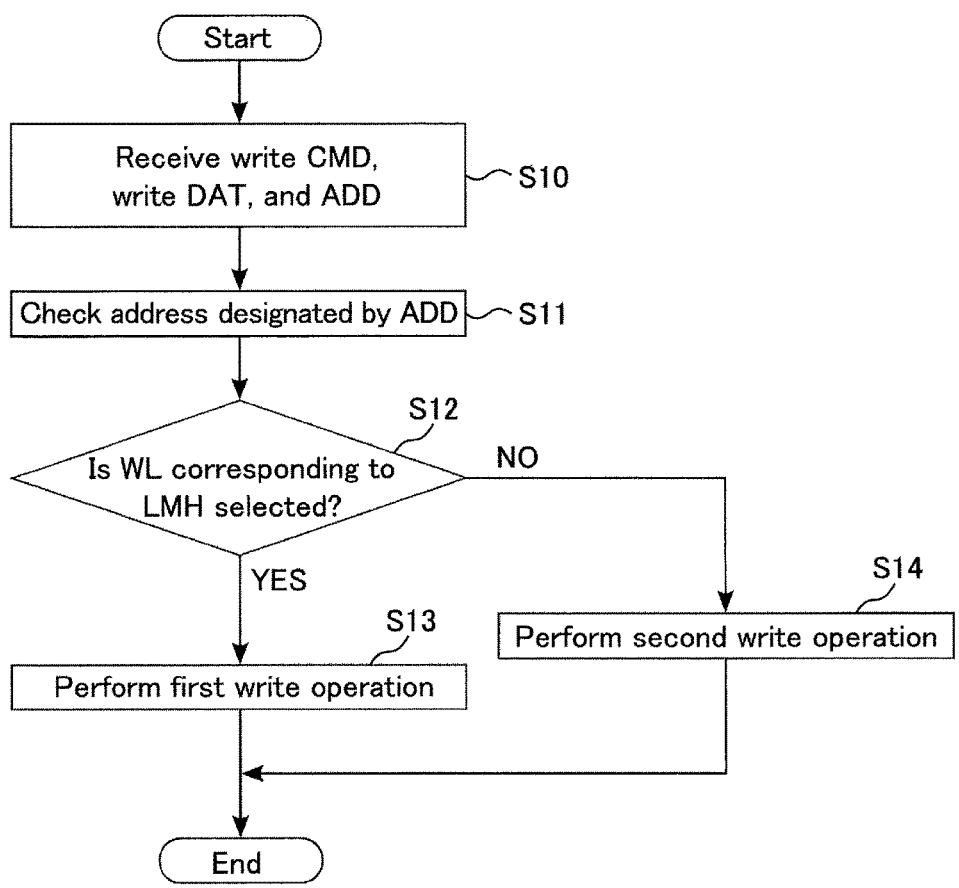
F I G. 6

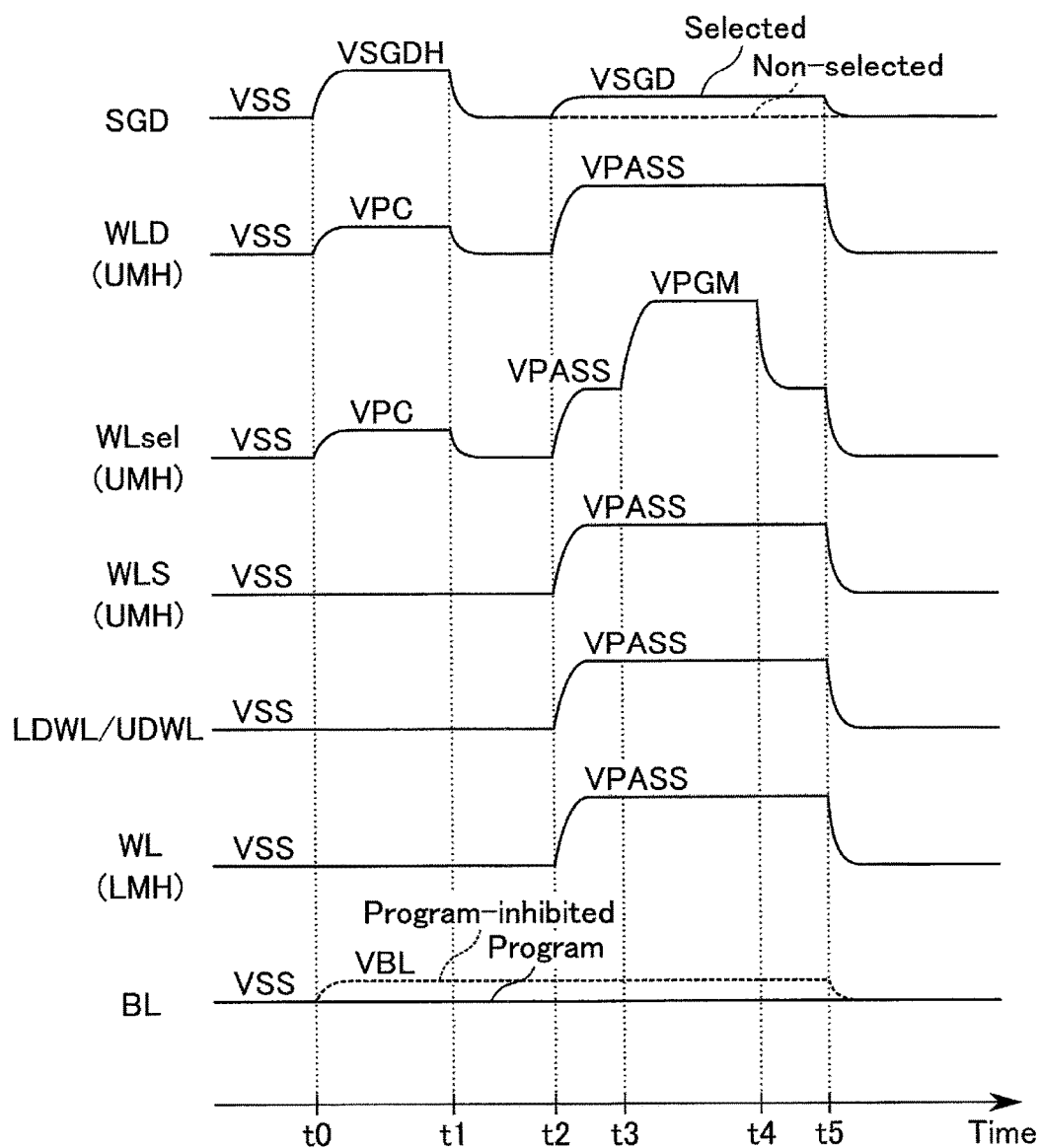
F I G. 9

SEMICONDUCTOR MEMORY DEVICE

CROSS-REFERENCE TO RELATED APPLICATIONS

This application is based upon and claims the benefit of priority from Japanese Patent Application No. 2017-242858, filed Dec. 19, 2017, the entire contents of which are incorporated herein by reference.

FIELD

Embodiments described herein relate generally to a semiconductor memory device.

BACKGROUND

A NAND flash memory is known as a semiconductor memory device.

BRIEF DESCRIPTION OF THE DRAWINGS

FIG. 2 is a circuit diagram showing an example of a circuit configuration of a memory cell array according to the embodiment.

FIG. 4 is a cross-sectional view of an example of a structure of a memory cell array according to the embodiment.

FIG. 6 is a flowchart showing an example of a write operation in the semiconductor memory device according to the embodiment.

FIG. 9 is a timing chart showing an example of voltages applied to the lines during a program operation in a second write operation in the semiconductor memory device according to a comparative example of the embodiment.

DETAILED DESCRIPTION

In general, according to one embodiment, a semiconductor memory includes includes a plurality of conductors, a pillar through the plurality of conductors, a controller. The plurality of conductors are stacked, with insulators being interposed therebetween. The pillar includes a first pillar portion, a second pillar portion, and a joint portion between the first pillar portion and the second pillar portion. Each of the portions where the pillar and the plurality of conductors cross functions as a transistor. The controller performs a write operation. Among the plurality of conductors through the first pillar portion, the conductor most proximal to the joint portion and one of the other conductors respectively function as a first dummy word line and a first word line. Among the plurality of conductors through the second pillar portion, the conductor most proximal to the joint portion and one of the other conductors respectively function as a second dummy word line and a second word line. In a write operation, the controller performs a program loop including a program operation which includes a pre-charge operation. In the pre-charge operation in a write operation in which the first word line is selected, the controller applies a first voltage higher than a ground voltage to the first word line, the first dummy word line, the second dummy word line, and the second word line. In the pre-charge operation in the write operation in which the second word line is selected, the controller applies a second voltage lower than a first voltage to the first word line, and applies the first voltage to each of the second dummy line and the second word line.

Hereinafter, the embodiment will be described with reference to the accompanying schematic drawings. The embodiment is an example of an apparatus and a method to embody a technical idea of the invention. In the explanations below, constituent elements having the same functions and configurations will be denoted by the same reference symbols. The numbers after the letters constituting the reference symbols are used to discriminate elements which are denoted by the reference symbols including the same letters and which have similar configurations. If there is no need of mutually distinguishing the elements which are denoted by the reference symbols that include the same letters, the same elements are denoted by the reference symbols that include only the same letters.

Embodiment

A semiconductor memory device according to an embodiment will be described.

[1] Configuration

[1-1] Overall Configuration of Semiconductor Memory Device 10

Figure 1:
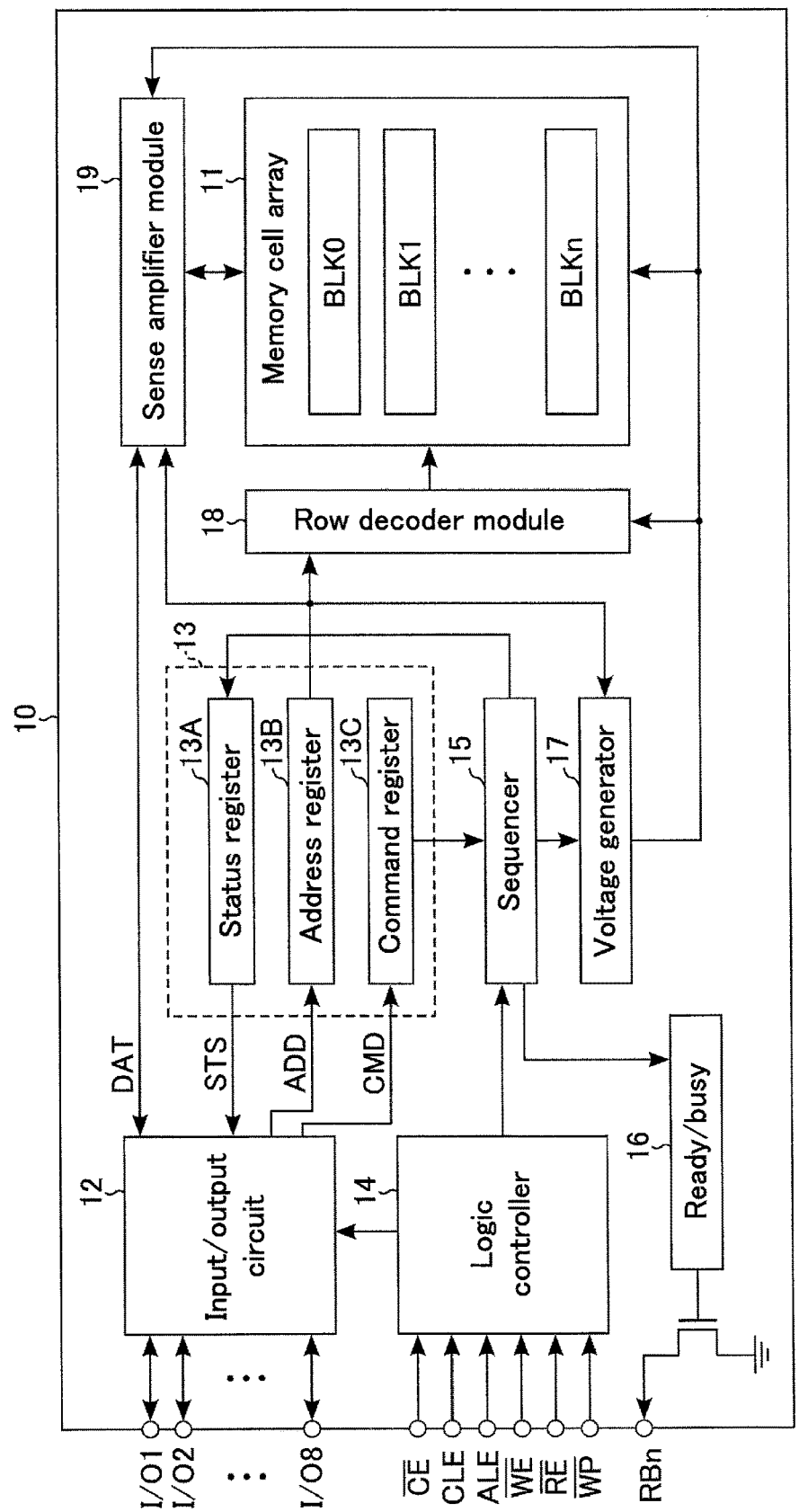
FIG. 1 is a block diagram showing an example of an entire configuration of a semiconductor memory device according to an embodiment.

FIG. 1 shows an example of an entire configuration of a semiconductor memory device 10 according to an embodiment. As shown in FIG. 1, the semiconductor memory device 10 includes a memory cell array 11, an input/output circuit 12, a register 13, a logic controller 14, a sequencer 15, a ready/busy controller 16, a voltage generator 17, a row decoder module 18, and a sense amplifier module 19.

The memory cell array 11 includes blocks BLK0 through BLKn (n is an integer equal to or greater than 1). A block BLK is a set of nonvolatile memory cells associated with bit lines and word lines, and is, for example, a unit of data erasure. The erase operation of the present invention is not limited to what is described herein but is described in, for example, "NONVOLATILE SEMICONDUCTOR MEMORY DEVICE", which was filed under U.S. patent application Ser. No. 13/235,389 on Sep. 18, 2011, and in "NONVOLATILE SEMICONDUCTOR MEMORY DEVICE", which was filed under U.S. patent application Ser. No. 12/694,690 on Jan. 27, 2010. The entire contents of these applications are incorporated herein by reference.

The input/output circuit 12 transmits and receives an 8-bit input/output signal, I/O1 through I/O8, for example, to and from an external memory controller. The input/output signal I/O includes, for example, data DAT, address information ADD, or a command CMD. For example, the input/output circuit 12 transfers data DAT received from the external memory controller to the sense amplifier module 19. The input/output circuit 12 transmits, to the external memory controller, the data DAT that is read from the memory cell array 11 by the sense amplifier module 19 and transferred from the sense amplifier module 19. The register 13 includes a status register 13A, an address register 13B, and a command register 13C. The status register 13A stores status information STS of the sequencer 15, for example, and transfers the status information STS to the input/output circuit 12 based on an instruction from the sequencer 15. The address register 13B stores address information ADD that is transferred from the input/output circuit 12. The address information ADD includes, for example, a block address, a page address, and a column address. The command register 13C maintains a command CMD that is transferred from the input/output circuit 12.

The logic controller 14 controls each of the input/output circuit 12 and the sequencer 15 based on various control signals received from the external memory controller. As various control signals, for example, a chip enable signal /CE, a command latch enable signal CLE, an address latch enable signal ALE, a write enable signal /WE, a read enable signal /RE, and a write protect signal /WP, are used.

The chip enable signal /CE is a signal to enable the semiconductor memory device 10. The command latch enable signal CLE is a signal for notifying the input/output circuit 12 that the received input/output signal I/O is a command CMD. The address latch enable signal ALE is a signal for notifying the input/output circuit 12 that the received input/output signal I/O is address information ADD. The write enable signal /WE is a signal for instructing the input/output circuit 12 to input an input/output signal I/O. The read enable signal /RE is a signal for instructing the input/output circuit 12 to output an input/output signal I/O. The write protect signal /WP is a signal for setting the semiconductor memory device 10 to a protected state when turning on/off the power source.

The sequencer 15 controls the operation of the entire semiconductor memory 10 based on the address information ADD and the command CMD stored in the register 13. For example, the sequencer 15 performs a write operation by controlling the voltage generator 17, the row decoder module 18, and the sense amplifying module 19.

The ready/busy control circuit 16 generates a ready/busy signal RBn based on an operation state of the sequencer 15. The ready/busy signal RBn is a signal for notifying the external controller of whether the semiconductor memory 10 is in a ready state in which a command from the external memory controller can be received or in a busy state in which a command from the external memory controller cannot be received.

The voltage generator 17 generates desired voltages based on the control of the sequencer 15, and supplies the generated voltages to the memory cell 11, the row decoder module 18, and the sense amplifier module 19, etc. For example, the voltage generator 17 applies a desired voltage to a word line that is selected based on a page address stored in the address register 13B.

The row decoder module 18 selects a block BLK for which various operations are to be carried out, based on a block address stored in the address register 13B. The row decoder module 18 applies the voltage supplied from the voltage generator 17 to, for example, word lines provided in the selected block BLK.

The sense amplifier module 19 reads the data DAT from the memory cell array 11, and transfers the read data DAT from the input/output circuit 12. The sense amplifying module 19 applies a desired voltage to each bit line based on the data DAT received from the input/output circuit 12.

[1-2] Configuration of Memory Cell Array 11
(Circuit Configuration of Memory Cell Array 11)

FIG. 2 shows an example of the circuit configuration of the memory cell array 11 of the embodiment, and one block BLK is taken as an example to represent the blocks constituting the memory cell array 11. As shown in FIG. 2, A block BLK includes, for example, four string units SU0 through SU3.

Each of the string units SU includes a plurality of NAND strings NS. A plurality of NAND strings NS are respectively associated with bit lines BL0 through BLm (m is an integer equal to or greater than 1). Each of the NAND strings NS includes memory cell transistors MT0 through MT15, dummy transistors LDT and UDT, and select transistors ST1 and ST2.

Each memory cell transistor MT includes a control gate and a charge storage layer, and stores data in a nonvolatile manner. Each of the dummy transistors LDT and UDT has a configuration similar to that of the memory cell transistor MT, for example, and is a memory cell transistor not used for storing data. Each of the select transistors ST1 and ST2 is used to select a string unit SU and a block BLK at the time of performing various types of processing.

In each of the NAND strings NS, the drain of a select transistor ST1 is coupled to a corresponding bit line BL. The memory cell transistors MT8 through MT15 are coupled in series between the source of the select transistor ST1 and the drain of the dummy transistor UDT. The source of the dummy transistor UDT is coupled to the drain of the dummy transistor LDT. The memory cell transistors MT0 through MT7 are coupled in series between the source of the dummy transistor LDT and the drain of the select transistor ST2.

In one block BLK, the control gates of each of the memory cell transistors MT0 through MT15 are respectively coupled to the word lines WL0 through WL15 in common. The control gates of the dummy transistors UDT are coupled to the dummy word line UDWL in common. The control gates of the dummy transistors LDT are coupled to the dummy word line LDWL in common. The gates of the select transistors ST1 respectively included in the string units SU0 through SU3 are coupled in common to the select gate lines SGD0 through SGD3, respectively. The gates of the select transistors ST2 are coupled in common to the select gate line SGS.

Different column addresses are respectively allocated to the bit lines BL0 through BLm, and each of the bit lines couples the select transistors ST1 of corresponding NAND strings NS among the plurality of blocks BLK in common. The word lines WL0 through WL15 and the dummy word lines UDWL and LDWL are provided in each block BLK. The source line SL is shared by the plurality of blocks BLK.

The plurality of memory cell transistors MT coupled to a common word line WL in a string unit SU are called a cell unit CU as a whole. The memory capacity of a cell unit CU changes in accordance with the number of bits of data stored in the memory cell transistors MT. For example, a cell unit CU stores one-page data when each memory cell transistor MT stores 1-bit data, and stores two-page data when each memory cell transistor MT stores 2-bit data.

In the following, a multi-level cell (MLC) mode in which 2-bit data is stored in each memory cell transistor MT will be explained as an example of the mode for writing the memory transistors MT.

(Threshold Voltage Distributions in Memory Cell Transistor MT)

Figure 3:
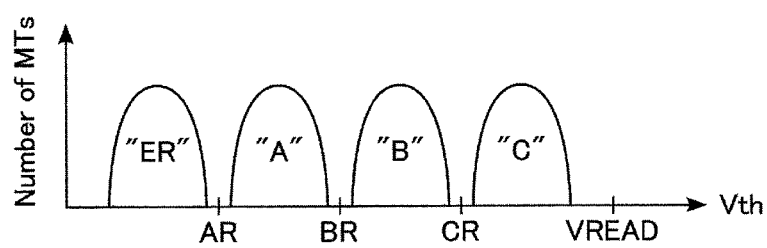
FIG. 3 is a threshold voltage distribution diagram showing an example of the distribution of threshold voltages of memory cell transistors according to the embodiment.

FIG. 3 shows an example of threshold voltage distribution for the memory cell transistors MT and read voltages, and the vertical axis indicates the number of the memory cell transistors MT, and the horizontal axis indicates threshold voltages Vth of the memory cell transistors MT. As shown in FIG. 3, if the MLC mode is adopted, the threshold voltages of the plurality of memory cell transistors MT form four threshold voltage distributions.

These four distributions are called "ER" level, "A" level, "B" level, and "C" level, from lower to higher threshold voltages. Different two-bit data are respectively allocated to "ER" level, "A" level, "B" level, and "C" level. A threshold voltage of a memory cell transistor 105 in an erase state is included in the "ER" level. A threshold voltage of a memory cell transistor MT in which data is written is included in the "ER" level," "A" level, "B" level, or "C" level, in accordance with the data written therein.

A read voltage is set between neighboring threshold voltage distributions. For example, a read voltage AR is set between a maximum threshold voltage in the "ER" level and a minimum threshold voltage in the "A" level. In a write operation using the read voltage AR, the read voltage AR is applied to a selected word line WL, and memory cell transistors MT corresponding to the "ER" level are turned on, and memory cell transistors MT including in the threshold voltage distributions of the "A" level or higher are turned off. It is thereby possible to determine by the sense amplifying module 19 whether in the threshold voltage distribution of the "ER" level or in the threshold voltage distributions of the "A" level or higher a threshold voltage of a memory cell transistor MT is included.

The other read voltages are set in a similar manner; for example, a read voltage BR is set between the "A" level and the "B" level, and a read voltage CR is set between the "B" level and the "C" level. A read pass voltage VREAD is set to a voltage higher than a maximum threshold voltage in the highest threshold voltage distribution. A memory cell transistor MT to which the read pass voltage VREAD is applied is turned on, regardless of data stored therein.

(Configuration of Memory Cell Array 11)

FIG. 4 is a cross-sectional view of an example of the cross-sectional structure of the memory cell array 11 in the embodiment, and shows the cross section of the memory cell array 11 and the X-, Y-, Z-axes, but the interlayer insulating films are omitted therefrom. The semiconductor memory device 10 includes a semiconductor substrate 20, conductors 21-28, memory pillars MH, and contact plugs BLC, as shown in FIG. 4.

The surface of the semiconductor substrate 20 corresponds to the X-Y plane. An conductor 21 is provided above the semiconductor substrate 20, with an insulating film being interposed therebetween. The conductor 21 is formed in a plate-like shape along the X-Y plane, and functions as a source line SL. Above the conductor 21, a plurality of slits SLT are arranged in the X-axis direction along the Y-Z plane. The structures arranged above the conductor 21 and between the neighboring slits SLT constitute one string unit SU.

For example, above the conductor 21 and between the neighboring slits SLT, an conductor 22, eight conductors 23, an conductor 24, an conductor 25, eight conductors 26, and an conductor 27 are arranged, from a lower layer to an upper layer. The neighboring conductors with respect to the Z-axis direction are stacked, with interlayer insulating films being interposed therebetween. Each of the conductors 22-27 are formed in a plate-like shape along with the X-Y plane.

The conductor 22 functions as a select gate line SGS. The eight conductors 23 function as word lines WL0 through WL7, from the lower layer to the higher layer. The conductors 24 and 25 function as dummy word lines LDWL and UDWL, respectively. The eight conductors 26 function as word lines WL8 through WL15, from the lower layer to the higher layer. The conductor 27 functions as a select gate line SGD.

A plurality of memory pillars MH are arranged in, for example, a staggered manner in the Y-axis direction (not shown), and each of the memory pillars functions as a NAND string NS. Each memory pillar MH is provided, passing through the conductors 22 through 27, in such a manner that the memory pillar extending from the upper surface of the conductor 27 reaches the upper surface of the conductor 21. Each memory pillar MH is formed by joining a plurality of pillar-shaped portions, for example, a lower pillar LMH and an upper pillar UMH, with a joint portion JT.

The upper pillar UMH is provided above the lower pillar LMH, and the lower pillar LMH and the upper pillar UMH are joined by the joint portion JT. For example, an outer diameter of the joint portion JT is larger than that of a portion where the lower pillar LMH and the joint portion JT are in contact, and larger than that of a portion where the upper pillar UMH and the joint portion JT are in contact. An interval between the conductors 24 and 25, i.e., a Z-direction thickness of the joint layer where the joint portion JT is provided is wider than an interval between the neighboring conductors 23, and is wider than an interval between the neighboring conductors 26.

The memory pillar MH includes, for example, a block insulating film 29, an insulating film 30, a tunnel oxide film 31, and a semiconductor material 32 having conductivity. The block insulating film 29 is provided in an inner wall of the memory hole that constitutes the memory pillar MH. The insulating film 30 is provided in an inner wall of the block insulating film 29, and functions as a charge storage layer of the memory cell transistor MT. The tunnel oxide film 31 is provided in an inner wall of the insulating film 30. The semiconductor material 32 is provided in an inner wall of the tunnel oxide film 31, and a current path of the NAND string NS is formed in the semiconductor material 32. The memory pillar MH may include a different material in the inner wall of the semiconductor material 32.

A portion where the memory pillar MH crosses the conductor 22 functions as the select transistor ST2. Portions where the memory pillar MH crosses the respective conductors 23 respectively function as the memory cell transistors MT0 through MT7. A portion where the memory pillar MH crosses the conductor 24 functions as the dummy transistor LDT.

Each of the select transistor ST2, the memory cell transistors MT0 through MT7, and the dummy transistor LDT is constituted by a portion where the lower pillar LMH passes through, as shown in FIG. 4.

A portion where the memory pillar MH crosses the conductor 25 functions as the dummy transistor UDT. Portions where the memory pillar MH crosses the respective conductors 26 respectively function as the memory cell transistors MT8 through MT15. A portion where the memory pillar MH crosses the conductor 27 functions as the select transistor ST1. Each of the dummy transistor UDT, the memory cell transistors MT8 through MT15, and the select transistor ST1 is constituted by a portion where the upper pillar UMH passes through, as shown in FIG. 4.

An conductor 28 is provided in a layer higher than the upper surface of the memory pillar MH, with an insulating film being interposed therebetween. The conductor 28 is formed in a shape of a line extending in the X-axis direction, and functions as the bit line BL. A plurality of conductors 28 are arranged in the Y-axis direction (not shown), and each of the conductors 28 is electrically connected to a corresponding memory pillar MH in each string unit SU. Specifically, in each string unit SU, a contact plug BLC having conductivity is arranged above the semiconductor material 32 of each memory pillar MH, and one conductor 28 is provided above the contact plug BLC. A coupling between the memory pillar MH and the conductor 28 may include a plurality of contact plugs or wiring.

The configuration of the memory cell array 11 is not limited to the above-described configuration. For example, the number of string units SU included in each block BLK may be determined as appropriate. The number of the memory cell transistors MT, the dummy transistors UDT and LDT, and the select transistors ST1 and ST2 included in each NAND string NS may be determined as appropriate.

The number of the word lines WL, the dummy word lines UDWL and LDWL, and the select gate lines SGD and SGS may be changed based on the number of the memory cell transistors MT, the dummy transistors UDT and LDT, and the select transistors ST1 and ST2. A plurality of conductors 22 respectively provided in a plurality of layers may be allocated to the select gate line SGS, and a plurality of conductors 27 respectively provided in a plurality of layers may be allocated to the select gate line SGD.

As for the other configurations in the memory cell array 11, they are described in, for example, U.S. patent application Ser. No. 12/407,403 filed on Mar. 19, 2009 and entitled "THREE-DIMENSIONALLY STACKED NONVOLATILE SEMICONDUCTOR MEMORY," U.S. patent application Ser. No. 12/406,524 filed on Mar. 18, 2009 and entitled "THREE-DIMENSIONALLY STACKED NON-VOLATILE SEMICONDUCTOR MEMORY", U.S. patent application Ser. No. 12/679,991 filed on Mar. 25, 2010 and entitled "NON-VOLATILE SEMINCONDUCTOR STORAGE DEVICE AND METHOD OF MANUFACTURING THE SAME", and U.S. patent application Ser. No. 12/532,030 filed on Mar. 23, 2009 and entitled "SEMICONDUCTOR MEMORY AND MANUFACTURING METHOD THEREOF" are applied. The entire contents of these applications are incorporated herein by reference.

[1-3] Configuration of Row Decoder Module 18

Figure 5:
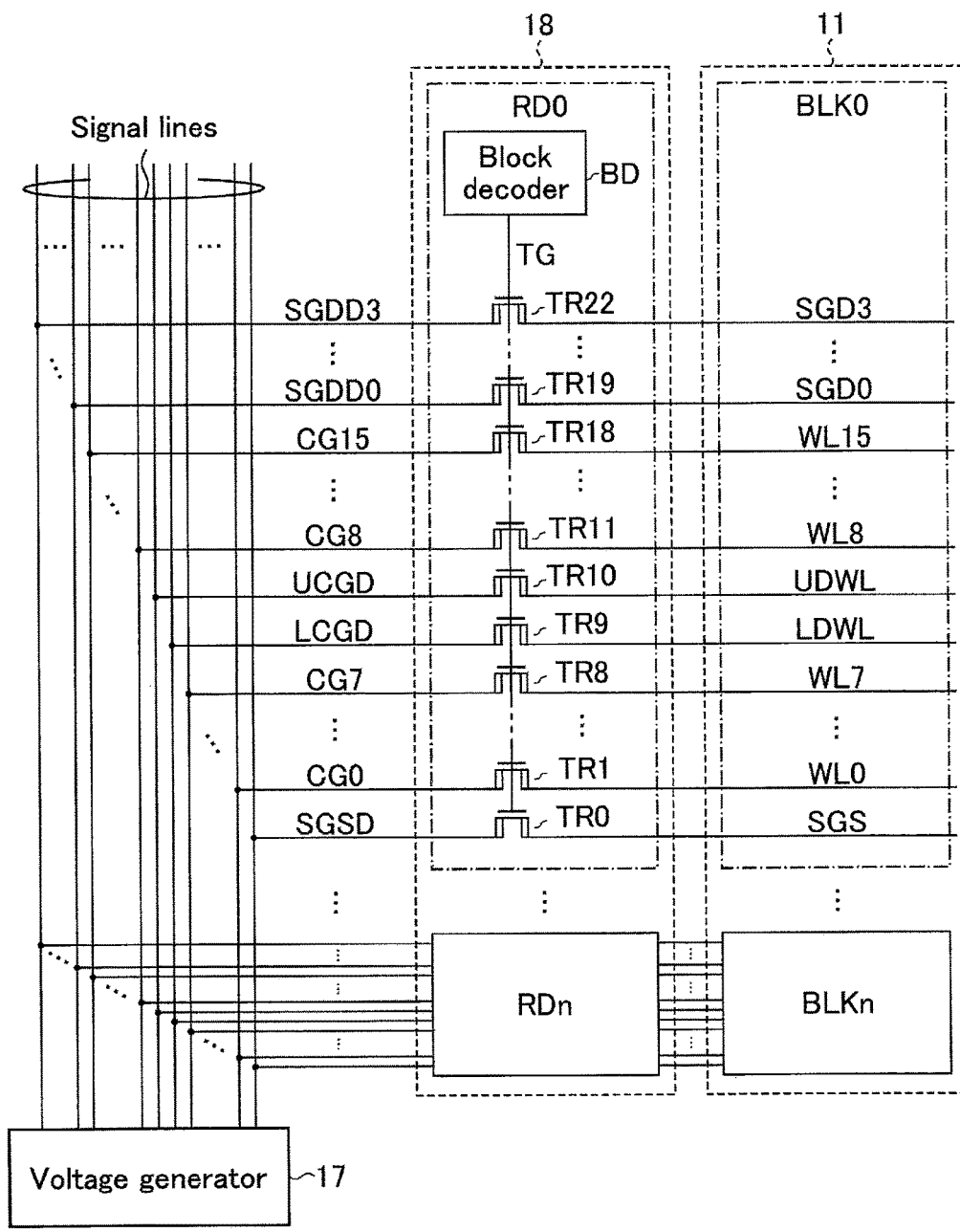
FIG. 5 is a circuit diagram showing an example of a circuit configuration of a row decoder module according to the embodiment.

FIG. 5 shows an example of the circuit configuration of the row decoder module 18 according to the embodiment, along with the interconnects between the voltage generator 17 and the row decoder module 18. As shown in FIG. 5, the row decoder module 18 includes row decoders RD0 through RDn.

The row decoders RD0 through RDn are respectively associated with the block BLK0 through BLKn. In other words, one row decoder RD is associated with one block BLK. In the following, the circuit configuration of the row decoder RD will be described in detail, taking the row decoder RD0 corresponding to the block BLK0 as an example.

The row decoder RD includes a block decoder BD and high-voltage n-channel MOS transistors TR0 through TR22. The block decoder BD decodes a block address, and applies a predetermined voltage to a transfer gate line TG based on a result of the decoding. The transfer gate line TG is coupled in common to the gates of the transistors TR0 through TR22. Each of the transistors TR0 through TR22 is coupled between a signal line extending from the voltage generator 17 and each of the lines provided in the block BLK0.

For example, the drain of the transistor TR0 is coupled to a signal line SGSD, and the source of the transistor TR0 is coupled to the select gate line SGS of the block BLK0. The drains of the transistors TR1 through TR8 are respectively coupled to the signal lines CG0 through CG7, and the sources of the transistors TR1 through TR8 are respectively coupled to the word lines WL0 through WL7 provided in the block BLK0. The drain of the transistor TR9 is coupled to the signal line LCGD, and the source of the transistor TR9 is coupled to the dummy word line LDWL.

The drain of the transistor TR10 is coupled to the signal line UCGD, and the source of the transistor TR10 is coupled to the dummy word line UDWL. The drains of the transistors TR11 through TR18 are respectively coupled to the signal lines CG8 through CG15, and the sources of the transistors TR11 through TR18 are respectively coupled to the word lines WL8 through WL15 provided in the block BLK0. The drains of the transistors TR19 through TR22 are respectively coupled to the signal lines SGDD0 through SGDD3, and the sources of the transistors TR19 through TR22 are respectively coupled to the select gate lines SGD0 through SGD3.

With the above-described configuration, the row decoder module 18 selects a block BLK for which various operations are to be carried out, and applies voltages supplied from the voltage generator 17 to a selected block BLK. Specifically, in an operation, block decoders BD corresponding to selected and non-selected blocks BLK apply an "H" level voltage and "L" level voltage respectively to transfer gate lines TG.

For example, if the block BLK0 is selected, the transistors TR0 through TR22 included in the row decoder RD0 are turned on, and the transistors TR0 through TR22 included in the other row decoders RD are turned off. In other words, a current path is formed between each of the lines provided in the block BLK0 and a corresponding signal line, and a current path between each of the lines in the other blocks BLK and a corresponding signal line is cut off. As a result, voltages respectively applied to the signal lines by the voltage generator 17 are respectively applied via the row decoder RD0 to the lines provided in the selected block BLK0.

[2] Operation (Outline of Write Operation)

In a write operation in the semiconductor memory device 10 according to the embodiment, the sequencer 15 repeatedly performs a program loop which is a combination of a program operation and a verify operation.

In a program operation, a program voltage VPGM is applied to a control gate of a memory cell transistor MT which is a target for a write operation, and a threshold voltage of the memory cell transistor MT rises. The program voltage VPGM is a high voltage that allows injecting electrons into the charge storage layer of a memory cell transistor MT, and is stepped-up every time the program loop is repeated. In the program operation, a self-boost technique is adopted for example, so that a rise of the threshold voltage in the program-inhibited memory cell transistor MT can be prevented.

The program operation in the embodiment further includes a pre-charge operation. The pre-charge operation decreases remaining electrons in a channel of a corresponding NAND string NS in a program-targeted memory cell transistor MT, and increases a channel potential in a NAND string NS corresponding to a program-inhibited memory cell transistor MT. The pre-charge operation is performed before a program voltage VPGM is applied to a selected word line WL.

The verify operation is a read operation to determine whether or not a threshold voltage of a memory cell transistor MT reaches a predetermined voltage. A read level at which a verify operation is performed may be changed as appropriate, in accordance with the progress of a write operation. A memory cell transistor MT that has passed a verify operation is set to a program-inhibit state for a next program operation and thereafter.

FIG. 6 is a flowchart showing an example of a write operation in the semiconductor memory device 10 according to the embodiment. As shown in FIG. 6, in a write operation, the semiconductor memory device 10 first receives a command CMD that instructs to perform a write operation, write data DAT, and address information ADD from an external memory controller (step S10).

Next, the sequencer 15 checks an address that is designated by the received address information ADD (step S11). More specifically, the sequencer 15 checks whether a word line WL selected based on the received address information ADD corresponds to the lower pillars LMH or to the upper pillars UMH.

If the selected word line WL corresponds to the lower pillars LMH (Yes in step S12), the sequencer performs a first write operation (step S13). If the selected word line WL corresponds to the upper pillars UMH on the other hand (No in step S12), the sequencer 15 performs a second write operation (step S14).

By performing the first write operation or the second write operation, the sequencer changes a threshold voltage of each of the memory cell transistors MT corresponding to the selected word line WL to a voltage in accordance with a corresponding write data DAT, and the sequencer 15 finishes the write operation.

The pre-charge operation in the program operation is different between the above-described first write operation and second write operation. The details of the first write operation and the second write operation is described below.

In the following description, a selected word line WL will be called a selected word line WLsel. A bit line BL coupled to a program-targeted memory cell transistor MT will be called a program-targeted bit line BL. A bit line BL coupled to a program-inhibited memory cell transistor MT will be called a program-inhibited bit line BL.

When a word line WL corresponding to the lower pillars LMH is selected, word lines WL provided between the selected word line WLsel and a dummy word line LDWL are called word lines WLD, and when a word line WL corresponding to the upper pillars UMH is selected, word lines WL provided between the selected word line WLsel and a select gate line SGD are also called word lines WLD.

When a word line WL corresponding to the lower pillars LMH is selected, word lines WL provided between the selected word line WLsel and a select gate line SGS are called word lines WLS, and when a word line WL corresponding to the upper pillars UMH is selected, word lines WL provided between the selected word line WLsel and a dummy word line UDWL are also called word lines WLS.

(First Write Operation)

Figure 7:
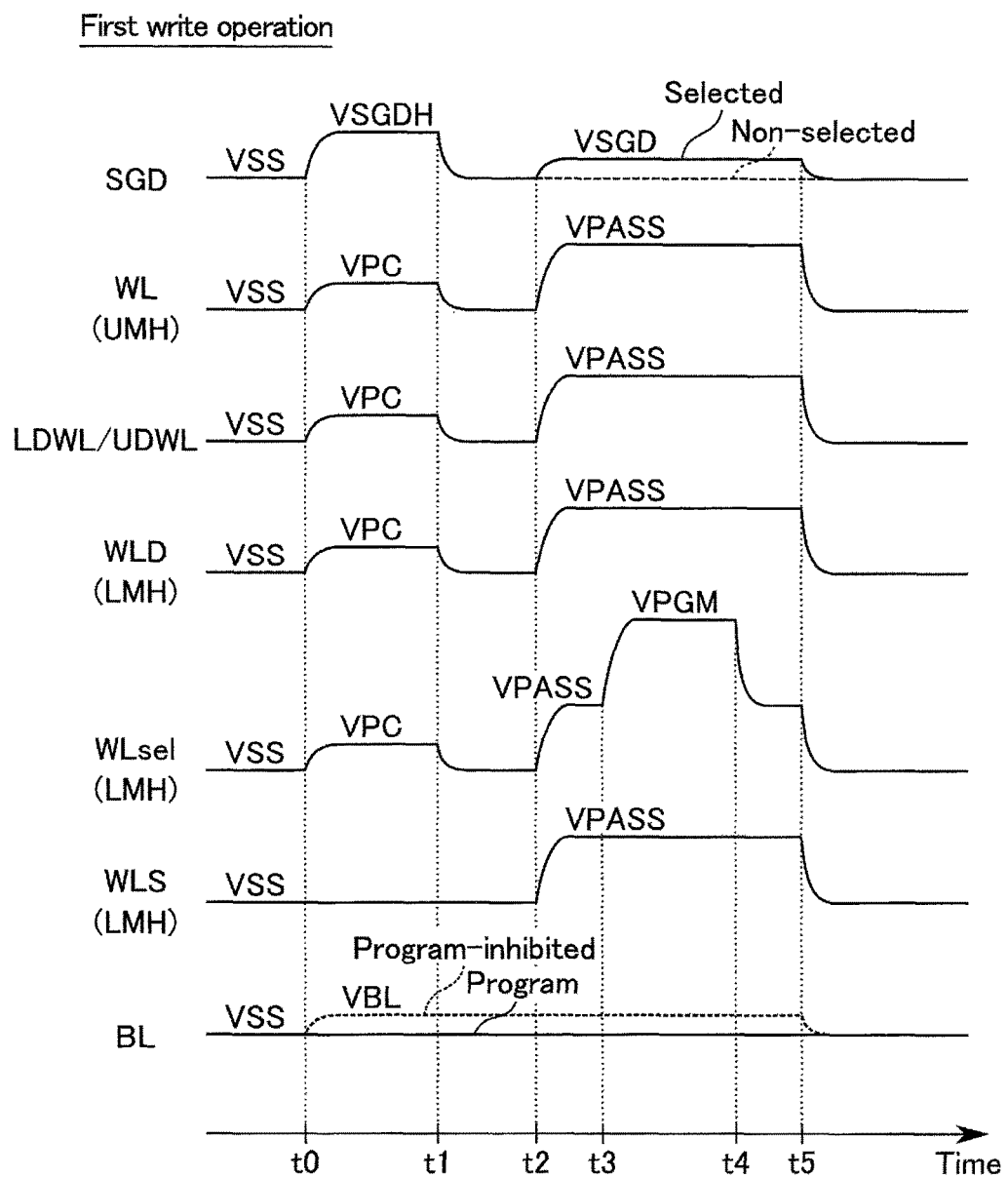
FIG. 7 is a timing chart showing an example of voltages applied to the lines during a program operation in a first write operation in the semiconductor memory device according to the embodiment.

FIG. 7 shows an example of voltages applied to the select gate line SGD, the word lines WL, the dummy word lines LDWL and UDWL, and the bit line BL in a program operation of the first write operation in the semiconductor memory device according to the embodiment. In the first write operation, a word line WL corresponding to the lower pillars LMH is selected; accordingly, FIG. 7 shows the voltages applied to the word lines WLD and WLS corresponding to the lower pillars LMH.

As shown in FIG. 7, in the initial state before time t0, the voltage applied to each of the select gate line SGD, the word lines WL, the dummy word lines LDWL and UDWL, and the bit lines BL is a voltage VSS. The voltage VSS is a ground voltage of the semiconductor memory device 10.

At time t0, the row decoder module 18 applies a voltage VSGDH to each select gate line SGD, and applies a voltage VPC to each of the word lines WL of the upper pillars UMH, the dummy word lines LDWL and UDWL, the word lines WLD of the lower pillars LMH, and the selected word line WLsel. The voltage VSGDH and the voltage VPC are higher than a voltage VSS. The voltage VPC is set to a voltage lower than, for example, the voltage VSGDH.

When a voltage VSGDH is applied to the select gate line SGD, the select transistor ST1 is turned on. When the voltage VPC is applied to each of the word lines WL of the upper pillars UMH, the dummy word lines LDWL and UDWL, the word lines WLD of the lower pillars LMH, and the selected word line WLsel, each of the transistors corresponding to these lines is turned on. At time t0, the sense amplifier module 19 applies the voltage VSS to a program-targeted bit line BL, and applies the voltage VBL to a program-inhibited bit line BL. The voltage VBL is higher than the voltage VSS.

At this time, in the NAND string NS to which the program-targeted bit line BL is coupled, the remaining electrons in the channels in the region from the memory cell transistor MT corresponding to the selected word line WLsel to the select transistor ST1 are drawn out to the bit line BL, as the transistors between the memory cell transistor MT corresponding to the selected word line WLsel and the select transistor ST1 are in an on state, and the voltage VSS is applied to this bit line BL.

On the other hand, in the NAND string NS to which the program-inhibited bit line BL is coupled, the channel potential in the region from the memory cell transistor MT corresponding to the selected word line WLsel to the select transistor ST1 becomes higher than the channel potential of a NAND string NS to which the program-targeted bit line BL is coupled, as the transistors between the memory cell transistor MT corresponding to the selected word line WLsel and the select transistor ST1 are in an on state, and the voltage VEL is applied to this bit line BL.

At time t1, the row decoder module 18 lowers the voltages applied to the select gate line SGD, the word lines WL of the upper pillars UMH, the dummy word lines LDWL and UDWL, the word lines WLD of the lower pillars LMH, and the selected word line WLsel to the level of VSS.

When the voltage applied to each select gate line SGD is lowered to VSS, the select transistor ST1 corresponding to each select gate SGD is turned off, and the channel of the corresponding NAND string NS is turned to a floating state. At this time, the channel potential of the NAND string NS to which the program-inhibited bit line BL is coupled remains at a raised level as a result of the operation performed at time t0.

The above-described operations at time t0 and time t1 correspond to the pre-charge operation in a program operation of the first write operation.

At time t2, the row decoder module 18 applies the voltage VSGD to a select gate line SGD corresponding to a selected string unit SU, and applies the voltage VSS to a select gate line SGD corresponding to a non-selected string unit SU. The voltage VSGD is higher than the voltage VSS, and lower than the voltage VSGDH.

When the voltage VSGD is applied to the select gate line SGD, and the voltage VBL is applied to the bit line BL, the select transistor ST1 is turned off, and the channel of the corresponding NAND string NS is turned to a floating state. In other words, in the selected string unit SU, the channel of the NAND string NS coupled to the program-inhibited bit line BL is in a floating state.

Then, the row decoder module 18 applies the voltage VPASS to each of the word lines WL of the upper pillars UMH, the dummy word lines LDWL and UDWL, the word lines WLD and WLS of the lower pillars LMH, and the selected word line WLsel. The voltage VPASS is higher than the voltage VSGD.

When the voltage VPASS is applied to each of the word lines of the upper pillars UMH, the dummy word lines LDWL and UDWL, and the word lines WLD and WLS of the lower pillars LMH, and the selected word line WLsel, the channel potential of the NAND string NS in a floating state is raised because of the coupling with the word lines WL (self-boosting). On the other hand, in a NAND string to which the program-targeted bit line BL is coupled, the rise of the channel potential is prevented, as the voltage VSS is applied to the program-targeted bit line BL.

At time t3, the row decoder module 18 applies the voltage VPGM to the selected word line WLsel.

When the program voltage VPGM is applied to the selected word line WLsel, electrons are injected into the charge storage layer of the program-targeted memory cell transistor MT because of a voltage difference between the selected word line WLsel and the channels in the NAND string NS to which the program-targeted bit line BL is coupled, and the threshold voltage of the program-targeted memory cell transistor MT rises.

In contrast, the voltage difference between the selected word line WLsel and the channel of the NAND string NS to which the program-inhibited bit line BL is coupled has been decreased by self-boosting, the change in the threshold voltage in the program-inhibited memory cell transistor MT is prevented.

At time t4, the row decoder module 18 lowers the voltage of the selected word line WLsel to the level of VPASS.

At time t5, the row decoder module 18 lowers the voltage of each of the word lines WL of the upper pillars UMH, the dummy word lines LDWL and UDWL, the word lines WLD and WLS of the lower pillars LMH, and the selected word line WLsel to VSS. Then, the voltage of the channel in the NAND string NS in the floating state is lowered along with the drop of the voltage of the word lines WL.

At time t5, the row decoder module 18 lowers the voltage of the select gate line SGD corresponding to the selected string unit SU to the level of VSS, and the sense amplifier module 19 lowers the voltage of the program-inhibited bit lines BL to the level of VSS. Then, the voltage of each of the lines returns to its initial state.

A series of the above-described operations corresponds to one program operation. The sequencer 15 performs a verify operation when the program operation finishes, and determines whether or not a next loop should be performed based on a result of the verify operation. Then, when the sequencer 15 detects, for example, passing of a verification of a highest level as a result of repeating the program loop, the sequencer 15 determines finishing the first write operation.

(Second Write Operation)

Figure 8:
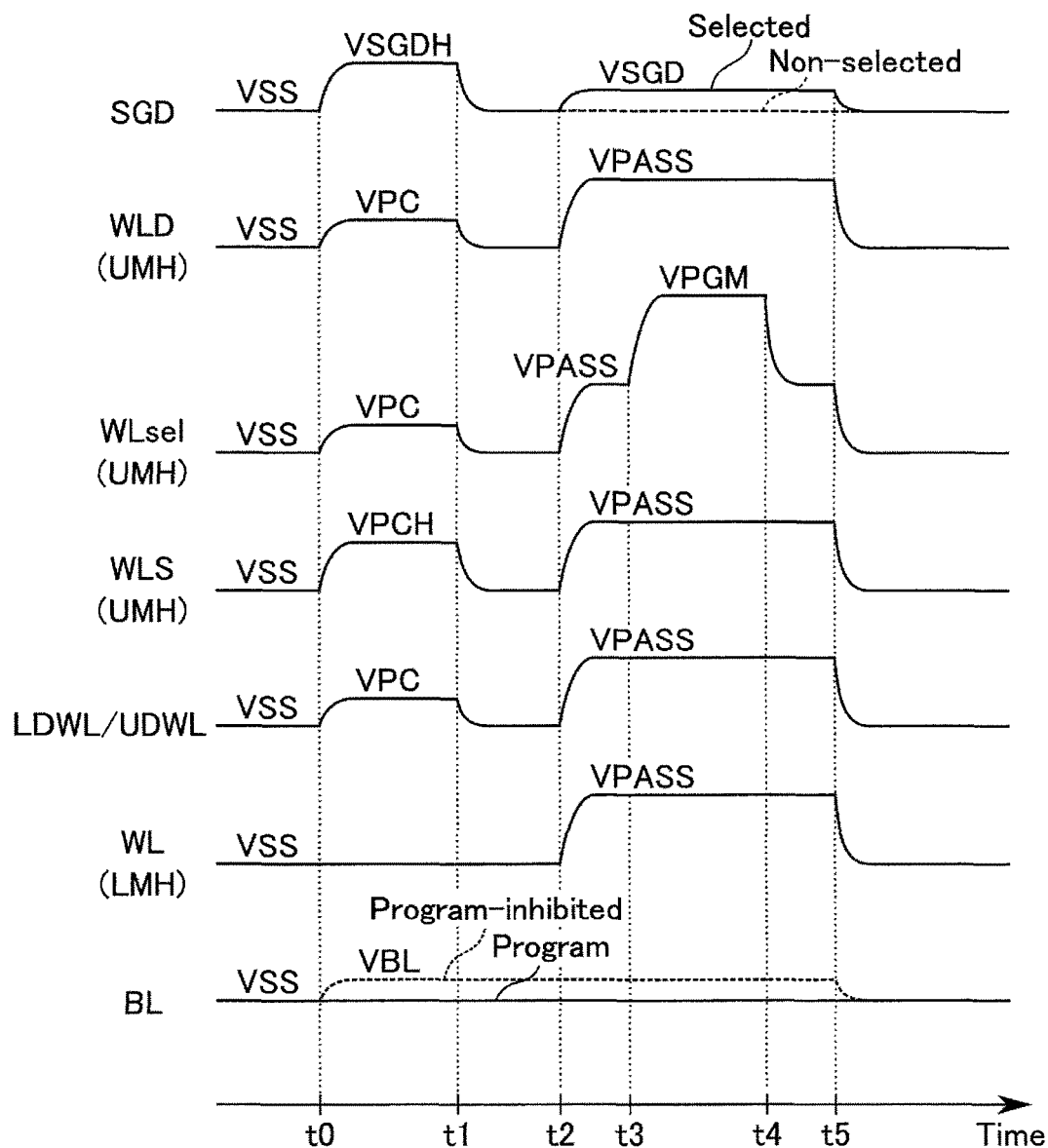
FIG. 8 is a timing chart showing an example of voltages applied to the lines during a program operation in a second write operation in the semiconductor memory device according to the embodiment.

FIG. 8 shows an example of voltages applied to the select gate line SGD, the word lines WL, the dummy word lines LDWL and UDWL, and the bit line BL in a program operation of the second write operation in the semiconductor memory device 10 according to the embodiment. In the second write operation, a word line WL corresponding to the upper pillars UMH is selected; accordingly, FIG. 8 shows the voltages applied to the word lines WLD and WLS corresponding to the upper pillars UMH.

As shown in FIG. 8, the operations performed at time t0 and time t1 (the pre-charge operation) in the program operation of the second write operation are different from those in the program operation of the first write operation which is explained with reference to FIG. 7 in the above.

Specifically, at time to, the row decoder module 18 applies: the voltage VSGDH to each of the select gate lines SGD; the voltage VPC to each of the word lines WLD of the upper pillars UMH, the selected word line WLsel, and the dummy word lines LDWL and UDWL; the voltage VPCH to the word lines WLS of the upper pillars UMH; and applies the voltage VSS to the word lines WL of the lower pillars LMH. The voltage VPCH is higher than the voltage VPC. It is preferable to turn a memory cell transistor MT on if the voltage VPCH is applied to the gate of the memory cell transistor MT, regardless of data to be stored therein, and the voltage VPCH is set to a voltage corresponding to a voltage VREAD, for example.

When a voltage VSGDH is applied to the select gate line SGD, the select transistor ST1 is turned on. When the voltage VPC is applied to each of the word lines WLD of the upper pillars UMH, the selected word line WLsel, and the dummy word lines LDWL and UDWL, each of the transistors corresponding to these lines is turned on.

When the voltage VPCH is applied to the word lines WLS of the upper pillars UMH, the memory cell transistors MT corresponding to the word lines WLS are turned on, regardless of the data stored therein, for example.

At time t0, the sense amplifier module 19 applies the voltage VSS to the program-targeted bit line BL, and applies the voltage VBL to the program-inhibited bit line BL. The voltage VBL is higher than the voltage VSS.

At this time, in the NAND string NS to which the program-targeted bit line BL is coupled, the remaining electrons in the channels in the region from the dummy transistor LDT to the select transistor ST1 are drawn out to by the bit line BL, as the transistors between the dummy transistor LDT and the select transistor ST1 are in an on state, and the voltage VSS is applied to the corresponding bit line BL.

In contrast, in the NAND string NS to which the program-inhibited bit line BL is coupled, the channel potential in the region from the dummy transistor LDT to the select transistor ST1 becomes higher than the channel potential of a NAND string NS to which the program-targeted bit line BL is coupled, as the transistors between the dummy transistor LDT and the select transistor ST1 are in an on state, and the voltage VBL is applied to the corresponding bit line BL.

At time t1, the row decoder module 18 lowers the voltage of each of the select gate line SGD, the word lines WLD and WLS of the upper pillars UMH, the selected word line WLsel, the dummy word lines LDWL and UDWL, and the word lines WL of the lower pillars LMH, to the level of VSS.

As the other operations in the second write operation are the same as those in the first write operation, the explanation thereof is omitted.

[3] Advantageous Effects

According to the above-described semiconductor memory device 10 in the embodiment, reliability of data stored in the memory cells can be improved. Hereinafter, detailed advantageous effects of the semiconductor memory device 10 according to the embodiment will be explained.

As a method of increasing the number of stacked memory cells in a memory cell of a semiconductor memory device in which the memory cells are three-dimensionally stacked, a plurality of memory holes are coupled in a direction of stacking, and these coupled memory holes are used to form one memory pillar MH. In this case, in the process of manufacturing the semiconductor memory device, an aspect ratio of an etching process when processing the memory holes can be achieved, thereby lowering the degree of difficulty in the etching process.

In the semiconductor memory device having such a structure, the memory pillar MH includes a joint portion JT for joining the memory holes in lower layers with the memory holes in upper layers. An interval between the memory cell transistors MT (or dummy transistors) adjacent to the joint portion JT is often designed to be wider than an interval between the other memory cell transistors MT.

In such a case, the characteristics of the memory cell transistors MT adjacent to the joint portion JT tend to be different from those of the other memory cell transistors MT. Furthermore, in a region corresponding to the joint portion JT in the channels of the NAND string NS, more electrons tend to remain than in other regions. The remaining electrons in the joint portion JT may cause a write error during a write operation performed in a memory cell transistor MT corresponding to the upper pillar UMH. An example of a model of write errors due to the joint portion JT will be explained.

FIG. 9 shows an example of voltages applied to each of the select gate line SGD, the word lines WL, the dummy word lines LDWL and UDWL, and the bit line BL in a program operation of the second write operation in a comparative example according to the embodiment.

As shown in FIG. 9, the operations performed at time t0 and time t1 (the pre-charge operation) in the program operation of the second write operation in the comparative example are different from those in the program operation of the second write operation which is explained with reference to FIG. 8.

Specifically, at time t0, the row decoder module 18 applies: the voltage VSGDH to each select gate line SGD; the voltage VPC to each of the word lines WLD of the upper pillars UMH and the selected word line WLsel; and applies the voltage VSS to the word lines WLS of the upper pillars UMH, the dummy word lines LDWL and UDWL, and the word lines WL of the lower pillar LMH.

At this time, in a NAND string to which a program-targeted bit line BL is coupled, remaining electrons in a channel in a region from a memory cell transistor MT corresponding to the selected word line WLsel to the select transistor ST1 are drawn out to the bit line BL, similarly to the program operation in the first write operation in the embodiment, which is above explained with reference to FIG. 7. In other words, in the pre-charge operation in the comparative example, the voltage VPC is applied to adjacent word lines, and the joint portion JT is not included in the region of the channel from which the remaining electrons are drawn out.

Figure 10:
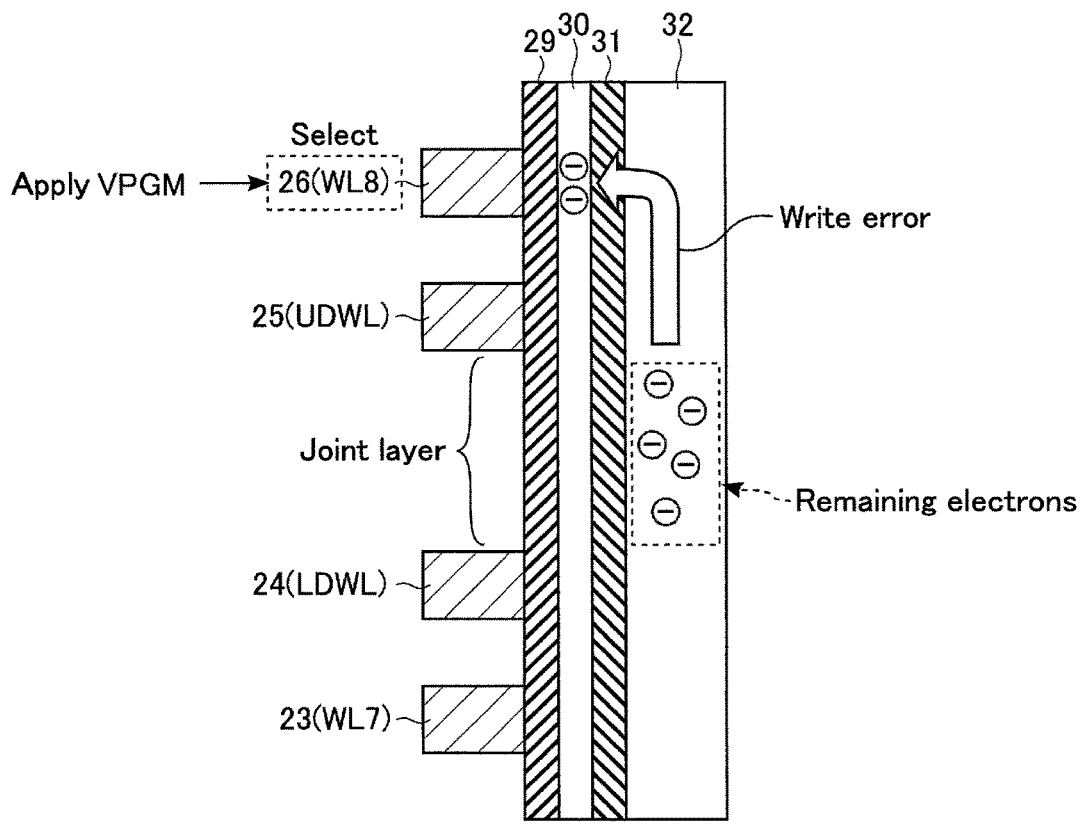
FIG. 10 is a schematic view of a behavior of electrons in a memory pillar during a program operation of a second write operation in a semiconductor memory device according to the comparative example of the embodiment.

FIG. 10 shows an example of the behavior of the electrons in the semiconductor pillars during a program operation in the second write operation in the comparative example of the embodiment. FIG. 10 shows a portion of the memory cell array 11 when the word line WL8 of the upper pillars UMH is selected as an example.

As shown in FIG. 10, in the program operation of the second write operation in the comparative example, when a program voltage is applied to the word line WL8 of the upper pillars UMH, the remaining electrons in the channel of the NAND string NS in the joint portion JT (the semiconductive material 32) may be injected into the charge storage layer of a selected memory cell transistor MT.

This phenomenon may occur in the second write operation in which a memory cell transistor MT corresponding to the upper pillars UMH is selected. This is because, in the first write operation in which a memory cell transistor MT corresponding to the lower pillars LMH is selected, a region corresponding to the joint portion JT is included in a region from which the remaining electrons in the channel of the NAND string NS are drawn away during the pre-charge operation.

Figure 11:
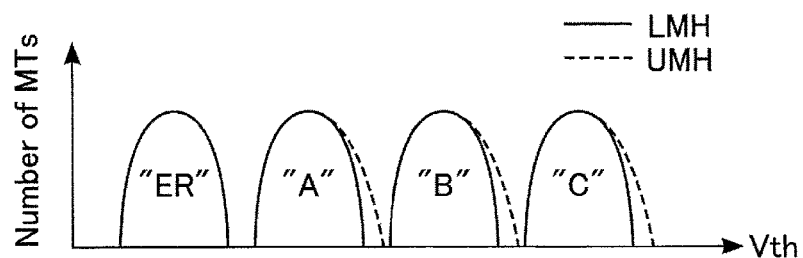
FIG. 11 is a threshold voltage distribution diagram showing an example of the distribution of threshold voltages of memory cell transistors according to the comparative example of the embodiment.

FIG. 11 shows an example of the threshold voltage distributions in the memory cell transistors MT in the comparative example of the embodiment. For the above-described reason, in the comparative example the upper ends of the threshold voltage distributions of the memory cell transistors MT corresponding to the upper pillar UMH may shift as shown in FIG. 11, compared to the threshold voltage distributions of the memory cell transistors MT corresponding to the lower pillars LMH.

In contrast, in the pre-charge operation in the program operation of the second write operation in the embodiment, the row decoder module 18 applies the voltage VPC to each of the dummy word lines UDWL and LDWL which are adjacent to the joint portion JT, and applies the voltage VPCH to the word lines WLS of the upper pillars UMH.

In other words, in the pre-charge operation of the embodiment, the dummy transistors LDT and UDT are in an on state, and the voltage from the dummy word lines UDWL and LDWL are applied even to the region corresponding to the joint portion JT. Furthermore, since the voltage VPCH is applied to the memory cell transistors MT corresponding to the word lines WLS of the upper pillars UMH for which a write operation is finished, these memory cell transistors MT are turned on, regardless of data written therein.

As a result, in the semiconductor memory device 10 according to the embodiment, the remaining electrons in the region from the memory cell transistor MT corresponding to the selected word line WLsel to the select transistor ST1 are drawn out to the bit line BL, and the remaining electrons in the region corresponding to the joint portion JT can be thereby reduced.

It is thereby possible in the semiconductor memory device 10 according to the embodiment to inhibit write errors due to electrons remaining in the joint portion JT, and to inhibit a widened threshold voltage distribution of the memory cell transistors MT corresponding to the upper pillar UMH. Accordingly, the semiconductor memory device 10 according to the embodiment can inhibit the number of error bits in the read operation, and improve reliability of data stored therein.

[4] Modifications, etc.

The semiconductor memory device according to the embodiment includes a plurality of conductors, a pillar (for example, MH in FIG. 4) through the plurality of conductors, a controller (for example, 15 in FIG. 1). The plurality of conductors are stacked, with insulators being interposed therebetween. The pillar includes a first pillar portion (for example, LMH in FIG. 4), a second pillar portion (for example, UMH in FIG. 4), and a joint portion between the first pillar portion and the second pillar portion (for example, JT in FIG. 4). Each of the portions where the pillar and the plurality of conductors cross functions as a transistor. The controller performs a write operation. Among the plurality of conductors through the first pillar portion, the conductor most proximal to the joint portion (for example, 24 in FIG. 4) and one of the other conductors (for example, 23 in FIG. 4) respectively function as a first dummy word line (for example, LDWL in FIG. 4) and a first word line (for example, WL(LMH) in FIG. 4). Among the plurality of conductors through the second pillar portion, the conductor most proximal to the joint portion (for example, 25 in FIG. 4) and one of the other conductors (for example, 26 in FIG. 4) respectively function as a second dummy word line (for example, UDWL in FIG. 4) and a second word line (for example, WL(UMH) in FIG. 4). In a write operation, the controller performs a program loop including a program operation which includes a pre-charge operation. In the pre-charge operation in a write operation in which the first word line is selected (for example, a first write operation in FIG. 7), the controller applies a first voltage (for example, VPC in FIG. 7) higher than a ground voltage to the first word line, the first dummy word line, the second dummy word line, and the second word line. In the pre-charge operation in the write operation in which the second word line is selected (for example, the second write operation in FIG. 8), the controller applies a second voltage (for example, VSS in FIG. 8) lower than a first voltage to the first word line, and applies the first voltage to each of the second dummy line and the second word line. Thus, the reliability of data stored in the semiconductor memory device 10 can be improved.

In the second write operation described in the embodiment, different operations may be performed for the dummy word line UDWL corresponding to the upper pillar UMH and the dummy word line LDWL corresponding to the lower pillar LMH, respectively. The present modification will be explained with reference to FIG. 12.

Figure 12:
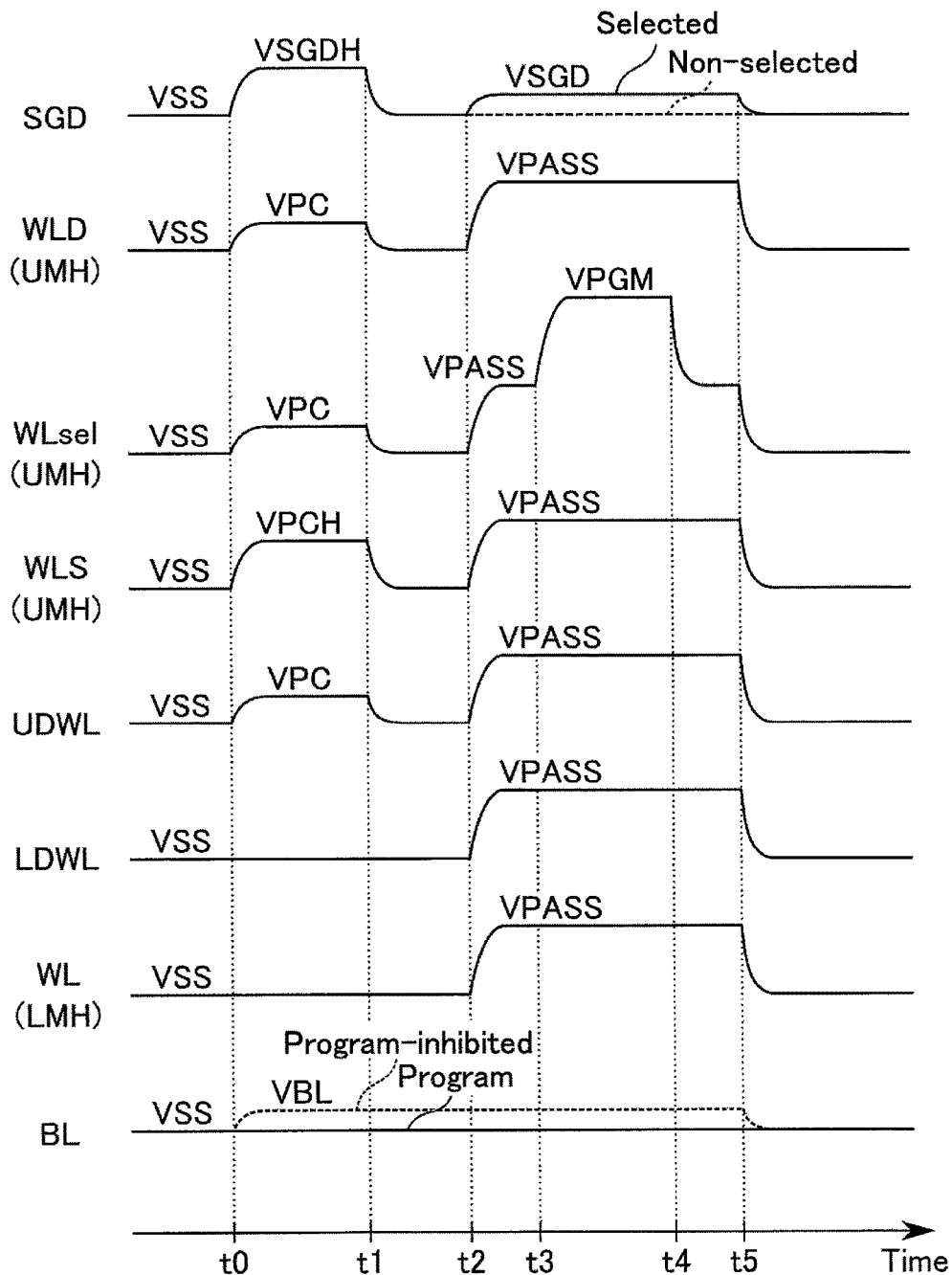
FIG. 12 is a timing chart showing an example of voltages applied to the lines during a program operation in a second write operation in the semiconductor memory device according to a modification of the embodiment.

FIG. 12 shows an example of voltages applied to each of the select gate line SGD, the word lines WL, the dummy word lines LDWL and UDWL, and the bit line BL, which all correspond to the selected block BLK, in a program operation of the second write operation in the modification according to the embodiment.

As shown in FIG. 12, the operations performed for the dummy word lines LDWL and UDWL at time t0 and time t1 in the program operation of the second write operation in the modification are different from those in the program operation of the second write operation which is explained with reference to FIG. 8.

Specifically, at time t0, the row decoder module 18 applies: the voltage VSGDH to each select gate line SGD; the voltage VPC to each of the word lines WLD of the upper pillar UMH, the selected word line WLsel, and the dummy word line LDWL; the voltage VSS to the word lines WLS of the upper pillar UMH, the dummy word line UDWL, and the word lines WL of the lower pillar LMH. Since the other operations in a second write operation in the modification of the embodiment are the same as those in the second write operation described with reference to FIG. 8, a detailed description of the operations is omitted.

Thus, in the pre-charge operation of the second write operation in the modification, the voltage VSS is applied to the dummy transistor LDT. In the pre-charge operation of the second write operation in the modification, the dummy transistor UDT corresponding to the upper pillar UMH is in an on status; thus, it is thereby possible to reduce the number of electrons remaining in the channel in the NAND string NS in the joint portion more than in the pre-charge operation of the second operation in the comparative example.

It is thereby possible in the second write operation in the modification to inhibit write errors due to electrons remaining in the joint portion JT, and to inhibit a widened threshold voltage distribution of the memory cell transistors MT corresponding to the upper pillar UMH. Accordingly, the semiconductor memory device 10 according to the modification of the embodiment can inhibit the number of error bits in the read operation, and improve reliability of data stored therein.

In the embodiment, a multi-level cell (MLC) mode in which two-bit data is stored in each memory cell transistor MT is explained as a mode for writing the memory transistors MT; however, the embodiment is not limited thereto. For example, 1-bit data may be stored in one memory cell transistor MT, or data of 3 or larger bits may be stored. Even in such cases, reliability of stored data can be improved by adopting the second write operation in the embodiment.

In the embodiment, the transistor adjacent to the joint portion JT is used as dummy transistors; however, the embodiment is not limited to this example. For example, a transistor provided on one side of the joint portion JT may be used as a dummy transistor, and a transistor provided on the other side may be used as a memory cell transistor, or transistors provided on both sides may be used as memory cell transistors. Even in such cases, similar advantageous effects as those achieved in the embodiment can be achieved by operating the word lines coupled to the memory cell transistors adjacent to the joint portion JT in a manner similar to the operation performed on the word line WLS corresponding to the upper pillars UMH, which is described in reference to FIG. 8 in the above, in the second write operation.

In the embodiment, the dummy transistor is provided adjacently to one or the other side of the joint portion JT; however, the embodiment is not limited to this example. For example, a plurality of transistors in a region adjacent to the joint portion JT may be used as dummy transistors. In such cases, in the second write operation, the operation to the dummy word line adjacent to the joint portion JT may be performed in a similar manner to the operation in the dummy word lines UDWL and LDWL, which is explained with reference to FIG. 8 in the above, to achieve advantageous effects similar to the advantageous effects achieved in the embodiment.

In the embodiment, one memory pillar MH has a two-stage structure consisting of a lower pillar LMH and an upper pillar UMH; however, the embodiment is not limited to this example. For example, one memory pillar may include three or more pillar portions, and two or more joint portions JT. In such a case, for example, a first write operation is performed in the pillar in which the selected transistor ST2 is provided, and a second write operation is performed in the other pillars. In a pre-charge operation of a second write operation in this example, the voltage VPC or VPCH may be applied to the word lines and dummy lines in the layers upper than the joint portion JT of the lowest layer, so that the remaining electrons can be drawn from all the joint portions JT, or the voltage VPC or VPCH may be applied to the word lines and dummy lines in the layers upper than the joint portion JT, so that the remaining electrons in the joint portion JT in the proximity of the pillar corresponding to a selected word line can be drawn.

In the embodiment, an outer diameter of the joint portion JT is larger than that of a portion where the lower pillar LMH and the joint portion JT are in contact, and larger than that of a portion where the upper pillar UMH and the joint portion JT are in contact; however, the embodiment is not limited to this example. For example, if the pillar is structured by directly joining the upper surface of the lower pillar LMH to the lower surface of the upper pillar UMH, the region where the upper surface of the lower pillar LMH is in contact with the lower surface of the upper pillar UMH corresponds to the joint portion JT.

In the embodiment, the write operation is described using a timing chart showing the voltages applied to a select gate line, word lines, and a dummy word line; however, the voltages applied to these lines are the same as those of a signal line that supplies a voltage from the voltage generator 17 to the row decoder module 18, for example.

In other words, in the embodiment, voltages applied to the lines and a period during which each of the voltages is applied can be roughly known by checking a voltage of a signal line corresponding to a line. To estimate voltages applied to a select gate line, word lines, and a dummy word line, etc., based on the voltages applied to each signal line coupled to the voltage generator 17, a voltage fall due to the transistor TR included in the row decoder RD may be considered. In this case, the voltages applied to each of a select gate line, word lines, and a dummy word line will be lowered for an amount of a voltage fall due to the transistor TR, compared to the voltages applied to the signal lines respectively corresponding to those lines.

In the present description, the term "coupled" means an electrical coupling, and does not exclude a coupling with an element being interposed in the coupling, for example. In the present description, "off state" refers to a state in which a voltage less than a threshold voltage of a transistor is applied to a gate of the transistor, and does not exclude a state in which a microcurrent, such as a leak current in a transistor, flows in the gate.

In the present description, the term "select gate line SGD" may be called "drain select gate line". The term "select gate line SGS" may be called "source select gate line". The term "select transistor ST1" may be called "drain select transistor". The term "select transistor ST2" may be called "source select transistor".

In the embodiments according to the present invention:

(1) The voltage applied to the word line selected for the read operation at the "A"-level may be, for example, 0 V to 0.55 V. The voltage is not limited thereto, and may be 0.1 V to 0.24 V, 0.21 V to 0.31 V, 0.31 V to 0.4 V, 0.4 V to 0.5 V, or 0.5 to 0.55 V.

The voltage applied to the word line selected for the read operation at the "B"-level is, for example, 1.5 V to 2.3 V. The voltage is not limited thereto, and may be 1.65 V to 1.8 V, 1.8 to 1.95 V, 1.95 V to 2.1 V, or 2.1 V to 2.3 V.

The voltage applied to the word line selected for the read operation at the "C"-level is, for example, 3.0 V to 4.0 V. The voltage is not limited thereto, and may be 3.0 V to 3.2 V, 3.2 to 3.4 V, 3.4 V to 3.5 V, 3.5 V to 3.6 V, or 3.6 V to 4.0 V.

The time (tR) for the read operation may be, for example, 25 μs to 38 μs, 38 μs to 70 μs, or 70 μs to 80 μs.

(2) The write operation includes the program operation and the verification operation as described above. In the write operation, the voltage first applied to the word line selected for the program operation may be, for example, 13.7 V to 14.3 V. The voltage is not limited thereto, and may be 13.7 V to 14.0 V or 14.0 V to 14.6 V.

The voltage first applied to the selected word line in the writing into an odd word line, and the voltage first applied to the selected word line in the writing into an even word line may be changed.

When the program operation is an incremental step pulse program (ISPP) type, a step-up voltage is, for example, about 0.5.

The voltage applied to the unselected word line may be, for example, 6.0 V to 7.3 V. The voltage is not limited thereto, and may be, for example, 7.3 V to 8.4 V or may be 6.0 V or less.

The pass voltage to be applied may be changed depending on whether the unselected word line is an odd word line or an even word line.

The time (tProg) for the write operation may be, for example, 1700 μs to 1800 μs, 1800 μs to 1900 μs, or 1900 μs to 2000 μs.

(3) In the erase operation, the voltage first applied to a well which is formed on the semiconductor substrate and over which the memory cells are arranged may be, for example, 12 V to 13.6 V. The voltage is not limited thereto, and may be, for example, 13.6 V to 14.8 V, 14.8 V to 19.0 V, 19.0 to 19.8 V, 19.8 V to 21 V.

The time (tErase) for the erase operation may be, for example, 3000 μs to 4000 μs, 4000 μs to 5000 μs, or 4000 μs to 9000 μs.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a plurality of conductors being stacked with insulators being interposed therebetween;
    a pillar through the plurality of conductors, the pillar including a first pillar portion, a second pillar portion above the first pillar portion, and a joint portion between the first pillar portion and the second pillar portion, the pillar functioning as a transistor in parts where the pillar crosses the respective conductors; and
    a controller configured to perform a write operation, wherein
    among the plurality of conductors through the first pillar portion, the conductor most proximal to the joint portion and one of the other conductors respectively function as a first dummy word line and a first word line,
    among the plurality of conductors through the second pillar portion, the conductor most proximal to the joint portion and one of the other conductors respectively function as a second dummy word line and a second word line,
    the controller
        performs a program loop which includes a program operation in the write operation, the program operation including a pre-charge operation,
        applies a first voltage higher than a ground voltage to the first word line, the first dummy word line, the second dummy word line, and the second word line, in the pre-charge operation in the write operation for which the first word line is selected, applies a second voltage lower than the first voltage to the first word line, and applies the first voltage to the second dummy word line and the second word line, in the pre-charge operation in the write operation for which the second word line is selected.

2. The device of claim 1, wherein
the controller applies the first voltage to the first dummy word line in the pre-charge operation in the write operation for which the second word line is selected.

3. The device of claim 2, wherein
one of the conductors provided between the conductor which functions as the second dummy word line and the conductor which functions as the second word line functions as a third word line, and
the controller applies a third voltage higher than the first voltage to the third word line in the pre-charge operation in the write operation for which the second word line is selected.

4. The device of claim 3, wherein
one of the conductors that is farther apart from the joint portion than the conductor that functions as the first word line, functions as a fourth word line,
the controller applies the second voltage to the fourth word line in the pre-charge operation in the write operation for which the first word line is selected.

5. The semiconductor memory device of claim 3, wherein
one of the conductors that is farther apart from the joint portion than the conductor that functions as the second word line, functions as a fifth word line,
the controller applies the first voltage to the fifth word line in the pre-charge operation in the write operation for which the second word line is selected.

6. The semiconductor memory device of claim 3, wherein
one of the conductors that is closer to the joint portion than the conductor that functions as the first word line, functions as a sixth word line,
the controller applies the first voltage to the sixth word line in the pre-charge operation in the write operation for which the first word line is selected.

7. The semiconductor memory device of claim 1, wherein
the controller applies the second voltage to the first dummy word line in the pre-charge operation in the write operation for which the second word line is selected.

8. The semiconductor memory device of claim 7, wherein
one of the conductors provided between the conductor which functions as the second dummy word line and the conductor which functions as the second word line, functions as a third word line, and
the controller applies a third voltage higher than the first voltage to the third word line in the pre-charge operation in the write operation for which the second word line is selected.

9. The semiconductor memory device of claim 8, wherein
one of the conductors that is farther apart from the joint portion than the conductor that functions as the first word line, functions as a fourth word line,
the controller applies the second voltage to the fourth word line in the pre-charge operation in the write operation for which the first word line is selected.

10. The semiconductor memory device of claim 8, wherein
one of the conductors that is farther apart from the joint portion than the conductor that functions as the second word line, functions as a fifth word line,
the controller applies the first voltage to the fifth word line in the pre-charge operation in the write operation for which the second word line is selected.

11. The semiconductor memory device of claim 8, wherein
one of the conductors that is closer to the joint portion than the conductor that functions as the first word line, functions as a sixth word line,
the controller applies the first voltage to the sixth word line in the pre-charge operation in the write operation for which the first word line is selected.

12. The semiconductor memory device of claim 1, wherein
the controller performs the pre-charge operation in the program operation before a program voltage is applied to a selected word line.

13. The semiconductor memory device of claim 12, wherein
the plurality of conductors through the pillar include a conductor that functions as a drain select gate line, and
the controller
applies a fourth voltage higher than the second voltage to the drain select gate line in the pre-charge operation, and
applies a fifth voltage higher than the second voltage and lower than the fourth voltage to the drain select gate line while a program voltage is applied to the selected word line.

14. The semiconductor memory of claim 1, wherein
the joint portion is adjacent to each of the first pillar portion and the second pillar portion.

15. The semiconductor memory of claim 1, wherein
each of a transistor provided in a portion where the conductor functioning as the first dummy word line and the first pillar portion cross each other, and a transistor provided in a portion where the conductor functioning as the second dummy word line and the second pillar portion cross each other, is not used for storing data.

16. A semiconductor memory device comprising:
a plurality of conductors being stacked with insulators being interposed therebetween;
a pillar through the plurality of conductors, the pillar including a first pillar portion, a second pillar portion, and a joint portion between the first pillar portion and the second pillar portion, and the pillar functioning as a transistor in parts where the pillar crosses the respective conductors; and
a controller configured to perform a write operation, wherein
one of the conductors through the first pillar portion functions as a first word line,
one of the conductors through the second pillar portion functions as a second word line,
one of the conductors provided between the conductor which functions as the second dummy word line and the joint portion functions as a third word line, and
the controller
performs a program loop which includes a program operation which includes a pre-charge operation in the write operation,
applies a first voltage higher than a ground voltage to the first word line, the second word line, and the third word line, in the pre-charge operation in the write operation for which the first word line is selected,
applies a second voltage lower than the first voltage to the first word line, applies the first voltage to the second word line, and applies a third voltage higher than the first voltage to the third word line in the pre-charge operation in the write operation for which the second word line is selected.

17. The semiconductor memory device of claim 16, wherein one of the conductors that is farther apart from the joint portion than the conductor that functions as the first word line, functions as a fourth word line, the controller applies the second voltage to the fourth word line in the pre-charge operation in the write operation for which the first word line is selected.

18. The semiconductor memory device of claim 17, wherein one of the conductors that is closer to the joint portion than the conductor that functions as the first word line, functions as a sixth word line, the controller applies the first voltage to the sixth word line in the pre-charge operation in the write operation for which the first word line is selected.

19. The semiconductor memory device of claim 16, wherein the plurality of conductors through the second pillar portion include a conductor that functions as a drain select gate line, and the controller applies a fourth voltage higher than the second voltage to the select gate line in the pre-charge operation, applies a fifth voltage higher than the second voltage and lower than the fourth voltage to the drain select gate line while a program voltage is applied to the selected word line.

20. The semiconductor memory of claim 16, wherein the joint portion is adjacent to each of the first pillar portion and the second pillar portion.

* * * * *